United States Patent
Chen

(10) Patent No.: US 7,916,055 B2
(45) Date of Patent: Mar. 29, 2011

(54) SIGMA-DELTA MODULATOR AND METHOD THEREOF

(75) Inventor: Kuo-Hsin Chen, Taipei (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 29 days.

(21) Appl. No.: 12/468,049

(22) Filed: May 18, 2009

(65) Prior Publication Data

US 2009/0289824 A1 Nov. 26, 2009

(30) Foreign Application Priority Data

May 20, 2008 (TW) ................ 97118502 A

(51) Int. Cl.
*H03M 3/00* (2006.01)
(52) U.S. Cl. .......... 341/143; 341/155; 341/144
(58) Field of Classification Search ........... 341/143, 341/155, 144, 122, 123
See application file for complete search history.

(56) References Cited

U.S. PATENT DOCUMENTS

| | | | |
|---|---|---|---|
| 5,731,769 A * | 3/1998 | Girardeau et al. | 341/61 |
| 5,815,102 A | 9/1998 | Melanson | |
| 6,924,757 B2 | 8/2005 | Adams et al. | |
| 6,943,716 B2 * | 9/2005 | Mallinson | 341/143 |

OTHER PUBLICATIONS

Anthony J. Magrath and Mark B. Sandler, J.AES, vol. 45, No. 6, Jun. 1997.

* cited by examiner

*Primary Examiner* — Brian Young
(74) *Attorney, Agent, or Firm* — Winston Hsu; Scott Margo

(57) ABSTRACT

A sigma-delta modulator includes an adder, a filter, a quantizer, and a clock rate controller. The adder receives an input signal and an output signal to generate a summation signal. The filter is coupled to the adder and filters the summation signal to generate a filtered signal. The quantizer is coupled to the filter as well as the adder and quantizes the filtered signal to generate the output signal according to a first clock signal. The clock rate controller is coupled to the quantizer and generates the first clock signal, wherein a frequency of the first clock signal is variable.

16 Claims, 4 Drawing Sheets

SIGMA-DELTA MODULATOR AND METHOD THEREOF

CROSS REFERENCE TO RELATED APPLICATIONS

This application claims priority of Taiwanese Application No. 097118502, filed on May 20, 2008 and is incorporated herein by reference.

BACKGROUND OF THE INVENTION

1. Field of the Invention

The present invention relates to a sigma-delta modulator and method thereof, and more particularly, to a sigma-delta modulator and method for controlling an output rate according to an amplitude of input signals.

2. Description of the Prior Art

Sigma-delta modulators are already commonly applied to analog-to-digital converters (ADC) and digital-to-analog converters (DAC) because the sigma-delta modulators have the capability of noise shaping to reduce quantization noise within signal bandwidths and to further increase the signal to noise ratio (SNR). However, due to over-sampling inherent in a sigma-delta modulator, its output rate is proportional to its capability of noise-suppression. Therefore, this higher output rate reduces the overall efficiency and may restrict applications of sigma-delta modulators.

In order to reduce the output rate of the sigma-delta modulator, several methods have been proposed, such as those disclosed in the U.S. Pat. No. 5,815,102 and 6,924,757, and the reference document "Digital power amplification using sigma-delta modulation and bit flipping" proposed in J.AES, vol. 45, no. 6, June 1997. In the U.S. Pat. No. 5,815,102, Melanson reduces the output rate of the sigma-delta modulator by using PDM-to-PWM conversion. However, this method is merely suitable for digital data, and the PDM-to-PWM conversion induces extra noise and thus needs a special correction mechanism. In U.S. Pat. No. 6,924,757, Adams adjusts the threshold values of a quantizer by adjusting the hysteresis parameters, and thereby the output rate of the sigma-delta modulator can be reduced. But this method is merely suitable for a one-bit quantizer only. For multi-bit applications, this method may become extremely complicated or may not work. In the reference document proposed in J.AES, a bit-flipping technique is used for reducing the output rate via changing the output code of the sigma-delta modulator. This method is applicable in a one bit sigma-delta modulator only.

SUMMARY OF THE INVENTION

According to an exemplary embodiment of the present invention, a sigma-delta modulator capable of controlling an output rate thereof is provided. The sigma-delta modulator includes an adder, a filter, a quantizer, and a clock rate controller. The adder receives an input signal and an output signal to generate a summation signal. The filter is coupled to the adder and filters the summation signal to generate a filtered signal. The quantizer is coupled to the filter as well as the adder and quantizes the filtered signal to generate the output signal according to a first clock signal. The clock rate controller is coupled to the quantizer and generates the first clock signal, wherein a frequency of the first clock signal is variable. For example, the frequency of the first clock signal is inversely proportional to an amplitude of the input signal.

According to another exemplary embodiment of the present invention, a method for controlling an output rate of a sigma-delta modulator is provided. The method includes: receiving an input signal and an output signal to perform an addition operation to generate a summation signal; filtering the summation signal to generate a filtered signal; generating a first clock signal having a variable frequency; quantizing the filtered signal to generate the output signal; and controlling the output of the output signal according to the first clock signal.

According to another exemplary embodiment of the present invention, a method for controlling an output rate of a sigma-delta modulator is provided. The method includes: receiving an input signal and an output signal to perform an addition operation to generate a summation signal; filtering the summation signal to generate a filtered signal; generating a first clock signal having a variable frequency; and quantizing the filtered signal to generate the output signal according to the first clock signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
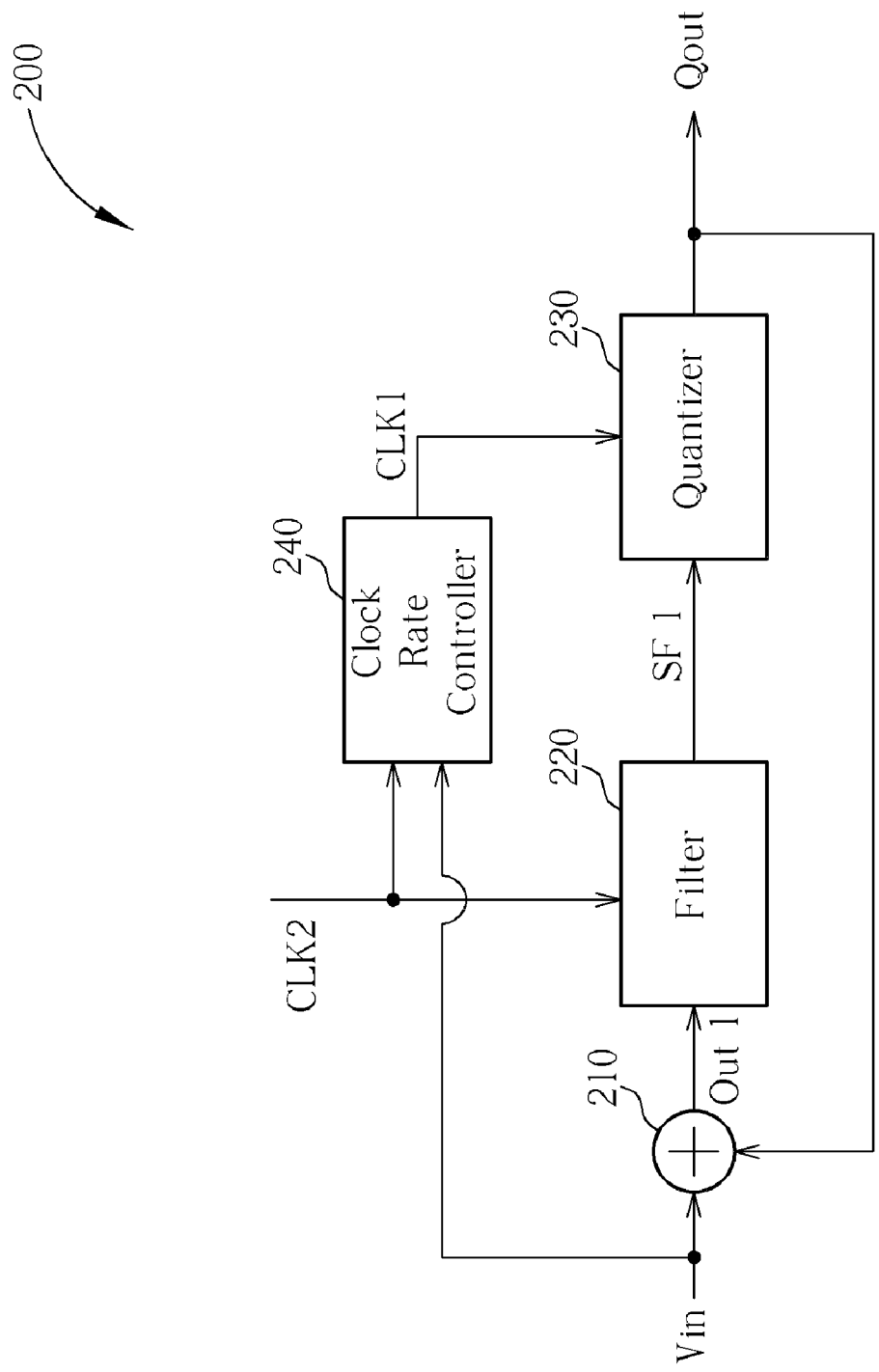
FIG. 1 is a schematic diagram of a sigma-delta modulator capable of controlling an output rate thereof according to a first embodiment of the present invention.

FIG. 1 is a schematic diagram of a sigma-delta modulator 200 capable of controlling an output rate thereof according to a first embodiment of the present invention. The sigma-delta modulator 200 includes an adder 210, a filter 220, a quantizer 230, and a clock rate controller 240. The adder 210 receives an input signal $V_{in}$ and an output signal $Q_{out}$ from the quantizer 230 and then performs an addition operation to generate a summation signal Out1. The filter 220 is coupled to the adder 210 and filters the summation signal Out1 to generate a filtered signal SF1. The quantizer 230 is coupled to the filter 220 as well as the adder 210 and quantizes the filtered signal SF1 to generate the output signal $Q_{out}$ according to a first clock signal CLK1. In addition, the clock rate controller 240 receives the input signal $V_{in}$ and generates the first clock signal CLK1 to the quantizer 230, wherein a frequency of the first clock signal CLK1 is variable and frequency variation thereof is associated with an amplitude of the input signal $V_{in}$. Note that the quantizer 230 operates according to the first clock signal CLK1, and the filter 220 operates according to a second clock signal CLK2.

Figure 2:
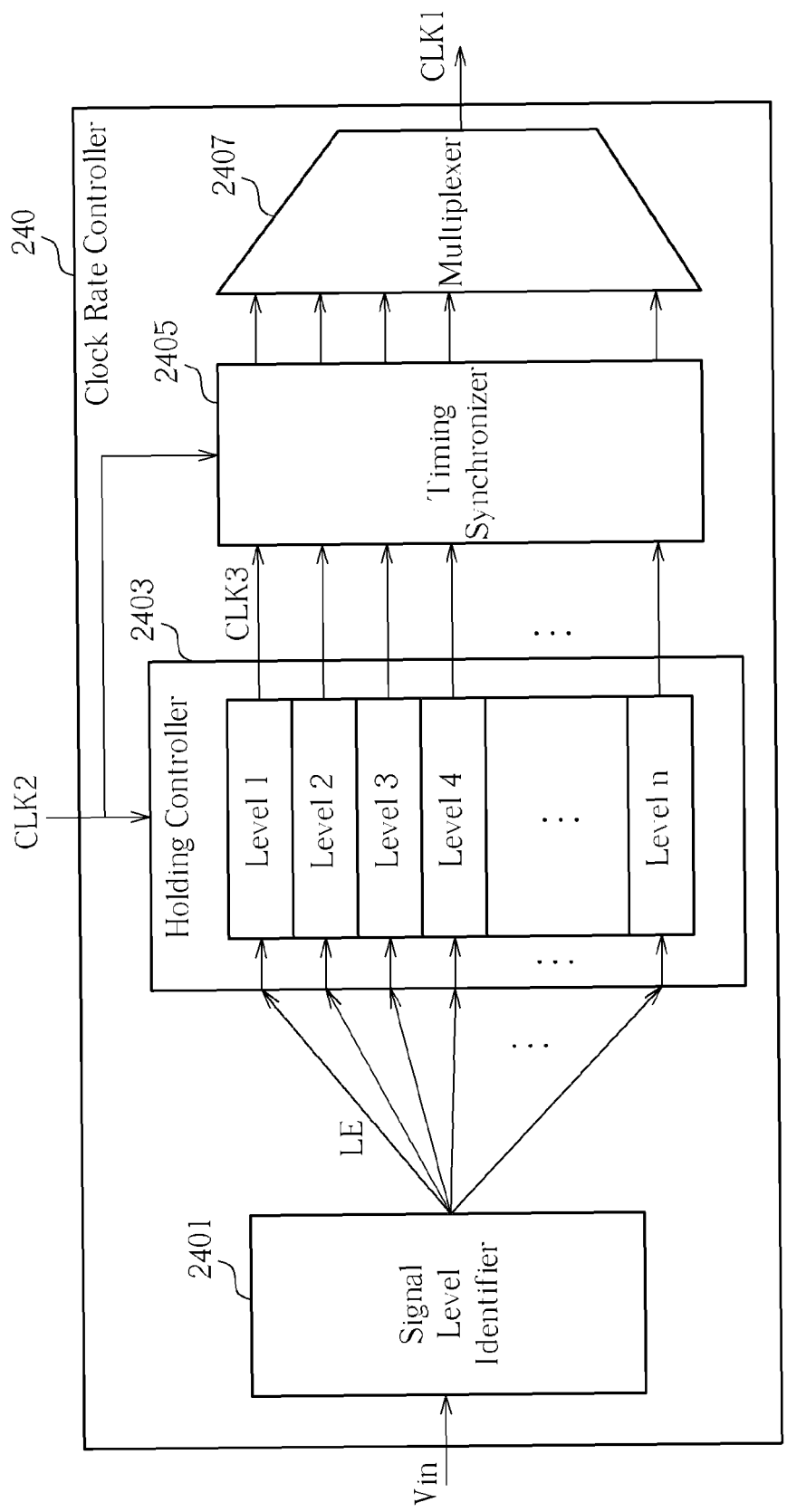
FIG. 2 is a schematic diagram illustrating the clock rate controller shown in FIG. 1.

FIG. 2 is a schematic diagram of the clock rate controller 240 of the sigma-delta modulator 200 shown in FIG. 1. The clock rate controller 240 includes a signal level identifier 2401, a holding controller 2403, a timing synchronizer 2405, and a multiplexer 2407. The signal level identifier 2401 receives the input signal $V_{in}$, determines which level of the holding controller 2403 the input signal $V_{in}$ belongs to, and generates a level enable signal LE according to the amplitude of the input signal $V_{in}$. The holding controller 2403 adjusts the second clock signal CLK2 to generate a third clock signal CLK3 to the timing synchronizer 2405 according to the level enable signal LE. The timing synchronizer 2405 then synchronizes the third clock signal CLK3 according to the second clock signal CLK2 to generate the first clock signal CLK1. Finally, the first clock signal CLK1 is output by the multiplexer 2407. In another embodiment, the timing synchronizer 2405 and the multiplexer 2407 can be optional. The abovementioned components are well-known to persons skilled in the art, and therefore the description is skipped here for the sake of brevity. In another embodiment, the clock rate controller 240 can be implemented with a voltage controlled oscillator (VCO), which adjusts the frequency of the first clock signal CLK1 according to the input signal $V_{in}$.

Figure 3:
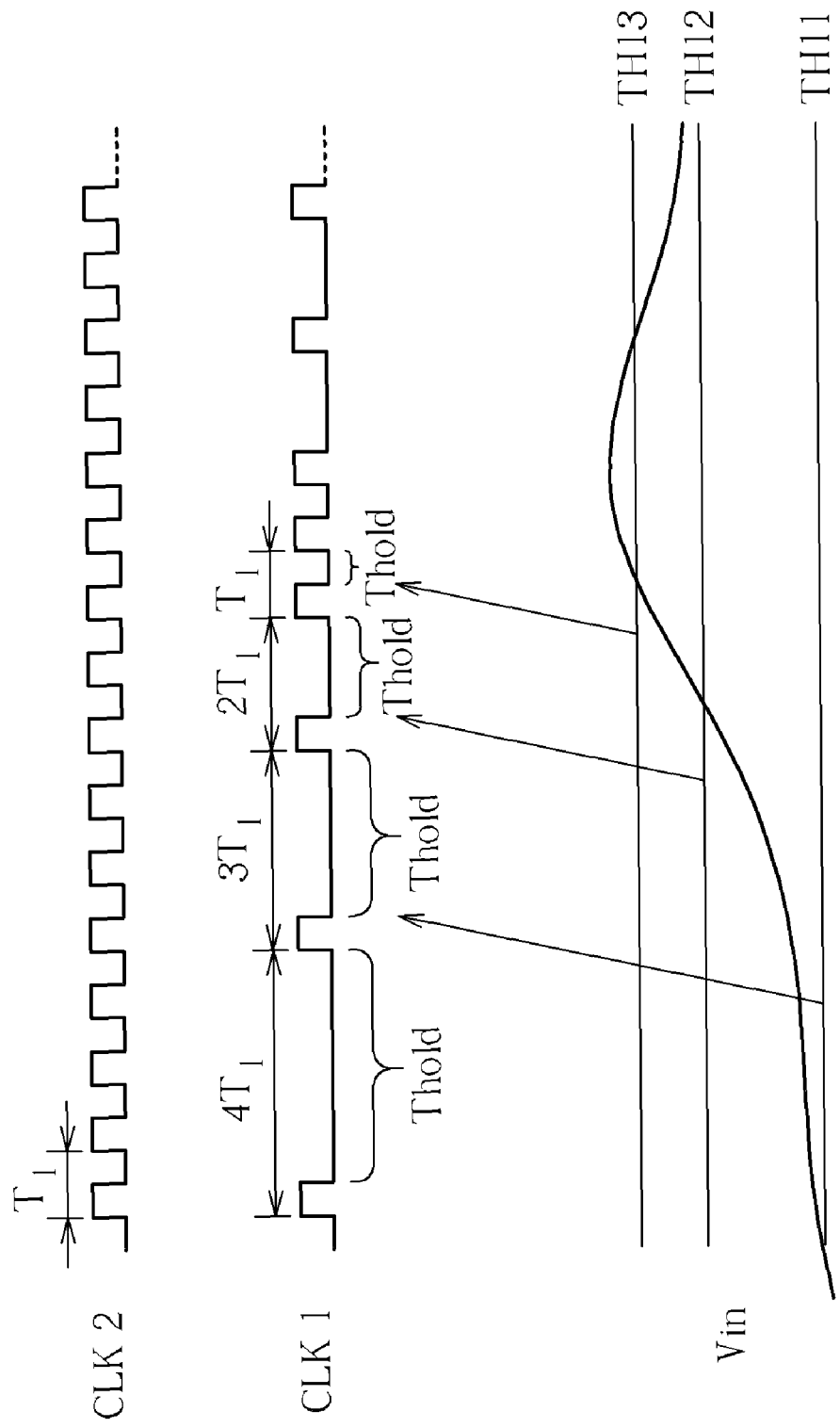
FIG. 3 is a schematic diagram illustrating how the clock rate controller shown in FIG. 1 adjusts the second clock signal to generate the first clock signal according to the amplitude of the input signal.

FIG. 3 is a schematic diagram illustrating how the clock rate controller 240 shown in FIG. 1 adjusts the second clock signal CLK2 to generate the first clock signal CLK1 according to the amplitude of the input signal $V_{in}$. As shown in FIG. 3, a period of the second clock signal CLK2 is $T_1$, which has a duty cycle of 50%. Thus, a time duration with a high level (logic "1") and a time duration with a low level (logic "0") are both $0.5T_1$. The first clock signal CLK1 also has a hold period $T_{hold}$ corresponding to the low level, wherein a duration of the hold period $T_{hold}$ is set according to the amplitude of the input signal $V_{in}$. In addition, three threshold values TH11, TH12, and TH13 are set in the clock rate controller 240, wherein TH11<TH12<TH13. Therefore, the second clock signal CLK2 can be adjusted to generate the first clock signal CLK1 according to the following equations:

$$T_{hold}=3.5T_1\ abs(V_{in})<TH11 \quad (1\text{-}1)$$

$$T_{hold}=2.5T_1\ TH11\leq abs(V_{in})<TH12 \quad (1\text{-}2)$$

$$T_{hold}=1.5T_1\ TH12\leq abs(V_{in})<TH13 \quad (1\text{-}3)$$

$$T_{hold}=0.5T_1\ abs(V_{in})\geq =TH13 \quad (1\text{-}4)$$

In the abovementioned embodiment, the threshold values are respectively set as TH11=0.1 5V, TH12=0.55V, and TH13=0.8V, but this should not be considered as a limitation of the present invention. It is shown that the duration of the hold period $T_{hold}$ is inversely proportional to the amplitude of the input signal $V_{in}$. In other words, when the amplitude of the input signal $V_{in}$ gets smaller, a longer hold period $T_{hold}$ is set. When the amplitude of the input signal $V_{in}$ gets higher, a shorter hold period $T_{hold}$ is set. Note that, within the hold period $T_{hold}$, the quantizer 230 does not perform quantization.

Please note that the amplitude of the abovementioned input signal $V_{in}$ is a normalized amplitude, but the scope of the present invention is not limited thereto. In addition, the values of the threshold values and the number of the threshold values are not limited and can be set depending on practical demands.

Figure 4:
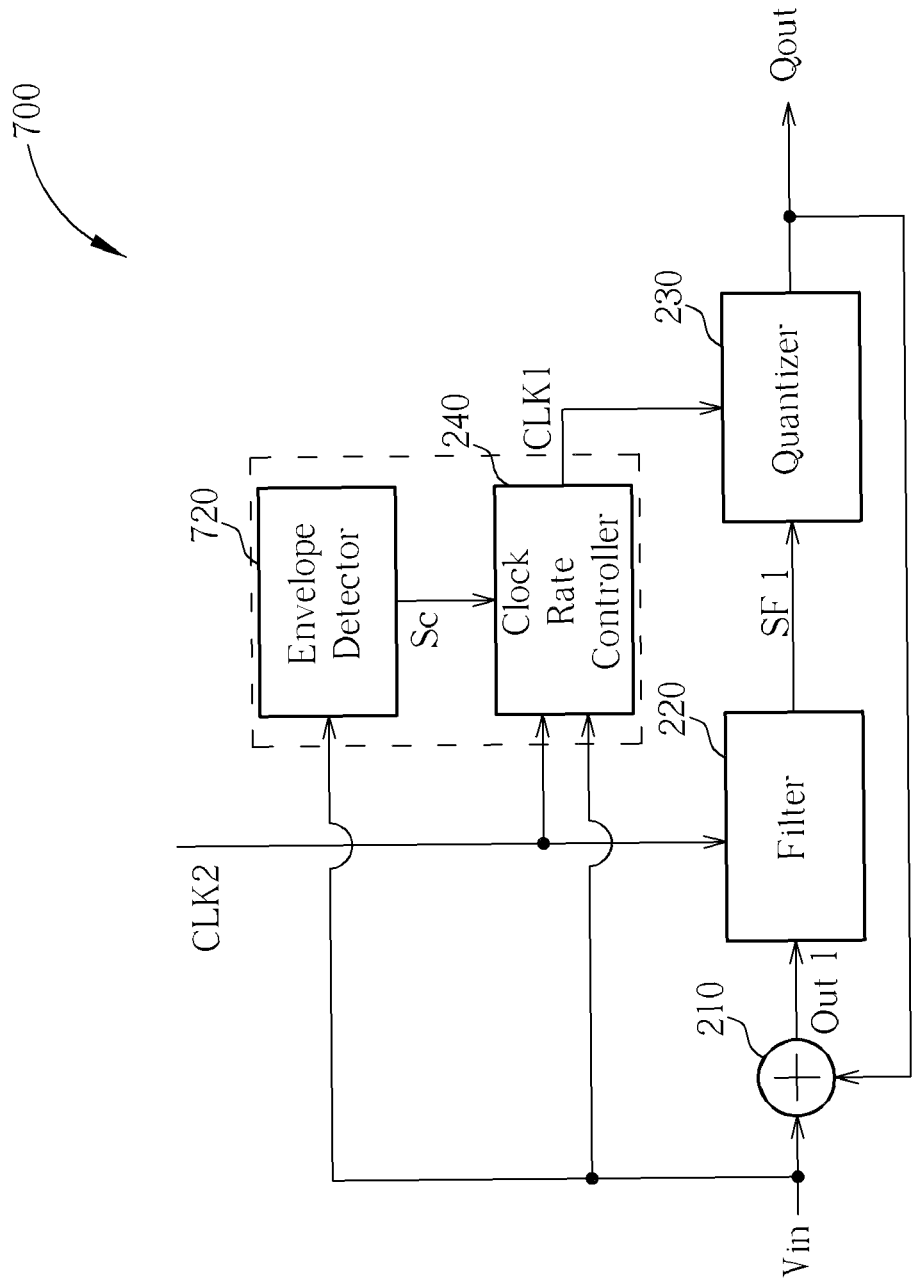
FIG. 4 is a schematic diagram of a sigma-delta modulator capable of controlling an output rate according to a second embodiment of the present invention.

In other embodiments, more functions can be designed into the sigma-delta modulator to provide more choices. FIG. 4 is a schematic diagram of a sigma-delta modulator 700 capable of controlling an output rate thereof according to a second embodiment of the present invention. As shown in FIG. 4, the sigma-delta modulator 700 is similar to the sigma-delta modulator 200 shown in FIG. 1 and differs in that the sigma-delta modulator 700 further includes an envelope detector 720 coupled to the clock rate controller 240 and receives the input signal $V_{in}$ such that an envelope of the input signal $V_{in}$ is detected and a control signal Sc is thus generated to the clock rate controller 240. Meanwhile, the clock rate controller 240 adjusts the second clock signal CLK2 to generate the first clock signal CLK1 according to the amplitude of the input signal $V_{in}$ and the control signal Sc.

The abovementioned embodiments are presented merely for describing the present invention, and in no way should be considered to be limitations of the scope of the present invention. In summary, the present invention provides a sigma-delta modulator capable of controlling its output rate and a related method. Through detecting the amplitude of the input signal, the duration of the hold period $T_{hold}$ of the quantizer is determined. Within the hold period $T_{hold}$, the quantizer does not perform a quantization operation. Therefore, the operating frequency of the quantizer can be significantly reduced. In addition, increasing the number of the threshold values set in the clock rate controller or adding an envelope detecting function to increase parameters for controlling the first clock signal CLK1 also can implement the present invention. Those skilled in the art should know that approximate modifications and alterations to the sigma-delta modulators 200 and 700 and their settings may be made without departing from the spirit of the present invention, which also belong to the scope of the present invention. Furthermore, applications and use of the present invention are versatile, and are especially suitable for circuit architectures with a power amplifier. The quantizer of the present invention can be implemented with a one-bit or multi-bit quantizer.

Those skilled in the art will readily observe that numerous modifications and alterations of the device and method may be made while retaining the teachings of the invention.

What is claimed is:

1. A sigma-delta modulator, comprising:
    an adder, receiving an input signal and an output signal to generate a summation signal;
    a filter, coupled to the adder, filtering the summation signal to generate a filtered signal, wherein the filter operates according to a second clock signal;
    a quantizer, coupled to the filter and the adder, quantizing the filtered signal to generate the output signal according to a first clock signal; and
    a clock rate controller, coupled to the quantizer, for adjusting the second clock signal to generate the first clock signal according to an amplitude of the input signal, wherein a frequency of the first clock signal is variable.

2. The sigma-delta modulator of claim 1, wherein the frequency of the first clock signal does not exceed a frequency of the second clock signal.

3. The sigma-delta modulator of claim 1, wherein the frequency of the first clock signal is inversely proportional to an amplitude of the input signal.

4. The sigma-delta modulator of claim 1, further comprising:
    an envelope detector, coupled to the clock rate controller, detecting an envelope of the input signal to generate a control signal;
    wherein the clock rate controller generates the first clock signal according to the control signal.

5. The sigma-delta modulator of claim 1, wherein the clock rate controller comprises:
    a signal level identifier, having a plurality of levels, the signal level identifier receiving the input signal, determining which level the input signal belongs to, and generating a level enable signal; and
    a holding controller, coupled to the signal level identifier, adjusting a second clock signal to generate the first clock signal according to the level enable signal.

6. The sigma-delta modulator of claim 1, wherein frequency variation of the first clock signal is associated with an amplitude of the input signal.

7. A method for controlling an output rate of a sigma-delta modulator, comprising:
- receiving an input signal and an output signal to perform an addition operation to generate a summation signal;
- filtering the summation signal to generate a filtered signal by utilizing a filter, wherein the filter operates according to a second clock signal;
- adjusting the second clock signal to generate the first clock signal according to an amplitude of the input signal, wherein a frequency of the first clock signal is variable;
- quantizing the filtered signal to generate the output signal; and
- controlling the output of the output signal according to the first clock signal.

8. The method of claim 7, wherein the step of generating the first clock signal comprises:
- setting a hold period during which the first clock signal corresponds to a predetermined level according to an amplitude of the input signal.

9. The method of claim 8, further comprising:
- adjusting a duration of the hold period to be inversely proportional to the amplitude of the input signal.

10. The method of claim 7, wherein the step of generating the first clock signal further comprises:
- detecting an envelope of the input signal to generate a control signal; and
- generating the first clock signal according to the control signal.

11. The method of claim 7, wherein frequency variation of the first clock signal is associated with an amplitude of the input signal.

12. A method for controlling an output rate of a sigma-delta modulator, comprising:
- receiving an input signal and an output signal to perform an addition operation to generate a summation signal;
- filtering the summation signal to generate a filtered signal by utilizing a filter, wherein the filter operates according to a second clock signal;
- adjusting the second clock signal to generate the first clock signal according to an amplitude of the input signal, wherein a frequency of the first clock signal is variable; and
- quantizing the filtered signal to generate the output signal according to the first clock signal.

13. The method of claim 12, wherein the frequency of the first clock signal does not exceed a frequency of the second frequency.

14. The method of claim 12, wherein the frequency of the first clock signal is inversely proportional to an amplitude of the input signal.

15. The method of claim 12, wherein the step of generating the first clock signal further comprises:
- detecting an envelope of the input signal to generate a control signal; and
- generating the first clock signal according to the control signal.

16. The method of claim 12, wherein frequency variation of the first clock signal is associated with an amplitude of the input signal.

* * * * *